(12) United States Patent
Wang

(10) Patent No.: US 7,259,456 B2
(45) Date of Patent: Aug. 21, 2007

(54) HEAT DISSIPATION APPARATUS FOR PACKAGE DEVICE

(75) Inventor: Tong-Hong Wang, Selangor D. E. (MY)

(73) Assignee: Advanced Semiconductor Engineering Inc., Kaohsiung (TW)

( * ) Notice: Subject to any disclaimer, the term of this patent is extended or adjusted under 35 U.S.C. 154(b) by 26 days.

(21) Appl. No.: 10/919,276

(22) Filed: Aug. 17, 2004

(65) Prior Publication Data

US 2005/0040520 A1   Feb. 24, 2005

(30) Foreign Application Priority Data

Aug. 18, 2003   (TW)   ............... 92122682 A

(51) Int. Cl.
*H01L 23/12* (2006.01)
*H01L 23/34* (2006.01)
*H01L 23/48* (2006.01)
*H01L 23/52* (2006.01)

(52) U.S. Cl. ............ 257/707; 257/704; 257/706; 257/713; 257/778; 257/E23.181

(58) Field of Classification Search ........ 257/704–707, 257/712, 713, 778, 737
See application file for complete search history.

(56) References Cited

U.S. PATENT DOCUMENTS

| | | | | |
|---|---|---|---|---|
| 5,739,585 A | * | 4/1998 | Akram et al. | 257/698 |
| 5,866,943 A | * | 2/1999 | Mertol | 257/712 |
| 6,133,064 A | * | 10/2000 | Nagarajan et al. | 438/106 |
| 6,219,254 B1 | * | 4/2001 | Akerling et al. | 361/763 |
| 6,515,870 B1 | * | 2/2003 | Skinner et al. | 361/800 |
| 2001/0033017 A1 | * | 10/2001 | Wang et al. | 257/698 |
| 2003/0067746 A1 | * | 4/2003 | Ishimine | 361/690 |

* cited by examiner

*Primary Examiner*—Nitin Parekh
(74) *Attorney, Agent, or Firm*—Birch, Stewart, Kolasch & Birch, LLP

(57) ABSTRACT

Heat dissipation apparatus applies to a package device on a substrate. The package device has an upper surface, a bottom surface, and a sidewall between the upper and bottom surfaces, in which the bottom surface thermally contacts the substrate through multitudes of conductive bumps. For dissipating heat from the bottom surface, the heat dissipation apparatus includes a first heat-dissipating structure contacting a portion of the bottom surface and a second heat-dissipating structure on the upper surface. With the surrounding association of the first and the second heat-dissipating structures, these structures release heats from the sidewall of the die. Such a heat dissipation apparatus is capable of discharging heat at three dimensions, preventing the conductive bumps from collapsing, and enhancing reliability.

13 Claims, 3 Drawing Sheets

HEAT DISSIPATION APPARATUS FOR PACKAGE DEVICE

This Non-provisional application claims priority under 35 U.S.C. § 119(a) on Patent Application No(s). 092122682 filed in Taiwan, Republic of China on Aug. 18, 2003, the entire contents of which are hereby incorporated by reference.

BACKGROUND OF THE INVENTION

1. Field of the Invention

The present invention generally relates to heat dissipation apparatus, and more particularly to heat dissipation apparatus for a package device.

2. Description of the Prior Art

Following the development of integrated circuit technology, the packing requirement is more and more strict for the IC (integrated circuit), because the packaging technology is directly related to the function of the electronic products. The conventional packaging methods include DIP (Dual In-line Package), QFP (Quad Flat Package), and PFP (Plastic Flat Package). When the frequency of IC exceeds 100 MHz, the conventional packaging method generates a phenomenon called "Cross-Talk". Furthermore, when the number of pins is larger than 208, the packaging becomes more difficult in the conventional packaging technology. In addition to the QFP technology, the BGA (ball grid array package) technology is the most popular packaging technology if the chip has many pins, such as graphic chips and chip module. Thus, in the present, the BGA technology is the best choice for the chip with a high density, and high performance, and multitudes of pins such as CPU (central processing unit) and south/north bridges chip on/in the motherboard.

On the other hand, the BGA packaging technology can be classified into five types: PBGA (Plastic BGA) substrate, CBGA (Ceramic BGA) substrate, FCBGA (Flip chip BGA) substrate, TBGA (Tape BGA) substrate, and CDPBGA (Cavity Down PBGA) substrate. Typically, the IC packaging process is packaged from a single IC, which needs a leadframe or substrate, and also include some processes such as the die attach, bonding, molding, or trim and form processes, such that the chip size of the packaged IC is greater than the chip after the IC is packaged. FCBGA located on the IC chip that has a metal gold (Au) or a solder bump thereon, which used to bond with PWB (printed wiring board).

However, when the operating speed of IC and the density of the pins are increased, the heat is an important factor that affects the reliability of chip, wherein the heat is generated from the RF device has amount of current and high frequency. Thus, an important issue for the development of the device is how to release the heat quickly and effectively.

SUMMARY OF THE INVENTION

According to abovementioned, the present invention provides heat dissipation apparatus that applies to the flip chip or BGA package device, and the adhesive material is not to fill around the conductive bump. Thus, the heat dissipation apparatus is capable of discharging the heat at three dimensions, to increase the discharging area and efficiency.

According to the reliability of the package device, the present invention provides a heat dissipation apparatus that utilizes a rigid heat-dissipating structure to discharge the heat, and supplies a support for the conductive bumps to prevent the conductive bumps from collapsing.

According to the abovementioned, one embodiment of the present invention provides a heat dissipation apparatus that applies on a package device on a substrate. The package device has a die and multitudes of conductive bumps. The die has an upper surface, a bottom surface, and a sidewall between the upper surface and the bottom surface, in which the bottom surface contacts the substrate through the multitudes of conductive bumps. The heat dissipation apparatus, for example, a rigid metal ring has a first heat-dissipating structure to release the heat from the portion of bottom surface, in which the first heat-dissipating structure contacts the portion of the bottom surface. The first heat-dissipating structure has two sidewalls, one of two sidewall used to define the circumference is larger than the outline of the sidewall of the die, and another sidewall used to define an opening to contain the overall conductive bumps therein. A second heat-dissipating structure, such as a heat sink located on the upper surface of the die, so as to release the heat from the upper surface, in which the first heat-dissipating structure and the second heat-dissipating structure cooperated to surround the sidewall of a die, and released the heat from the sidewall of a die. Furthermore, the thermally conductive adhesive material filled between the first heat-dissipating structure and second heat-dissipating structure. Such as a heat dissipation apparatus is capable of discharging heat at three dimensions, preventing the conductive bumps from collapsing, and enhancing reliability.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the following detailed description, and the accompanying drawings, which are given by way of illustration only, and thus are not limitative of the present invention, and wherein.

DESCRIPTION OF THE PREFERRED EMBODIMENT

Some sample embodiments of the invention will now be described in greater detail. Nevertheless, it should be recognized that the present invention can be practiced in a wide range of other embodiments besides those explicitly described, and the scope of the present invention is expressly not limited except as specified in the accompanying claims.

Figure 1A:
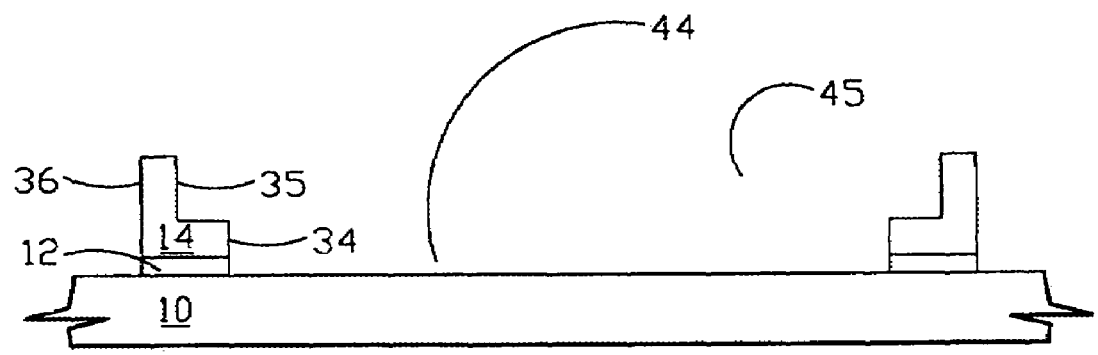
FIGS. 1A to 1D are schematic cross-section views of assembling the die on the heat dissipation apparatus of the first embodiment in accordance with the present invention disclosed herein.

Referring to FIG. 1A to FIG. 1D, show cross-section views of assembling the die on the heat dissipation apparatus of the first embodiment. Referring to FIG. 1A, a first heat-dissipating structure is placed on the substrate 10. In one embodiment, the substrate 10 can be made of any material, in which the surface of substrate 10 can be a thermally conductive surface or include the plurality of thermally conductive pad that cab be adhered. Then, the first heat-dissipating structure consists of the thermally conductive adhesive layer 12 and the rigid thermally conductive ring 14, in which the thermally conductive adhesive layer 12 located between the substrate 10 and the thermally conductive ring 14. The material of the thermally conductive adhesive layer 12 is a dielectric material, and more preferred material is a high thermally conductive material.

In one embodiment, the thermally conductive ring 14 has an inner wall 34, a middle wall 35, and an outer wall 36 in parallel, in which the inner wall 34 defines an opening 44, the middle wall 35 defines an opening, and an outer wall 36 defines an outline of thermally conductive ring 14. Furthermore, the middle wall 35 located on the inner wall 34 in parallel and between the inner wall 34 and outer wall 36, and the opening 45 is larger than the opening 44. In addition, the thermally conductive ring 14 is made of the thermally conductive material, such as Al (aluminum) or Cu (copper).

Figure 1B:
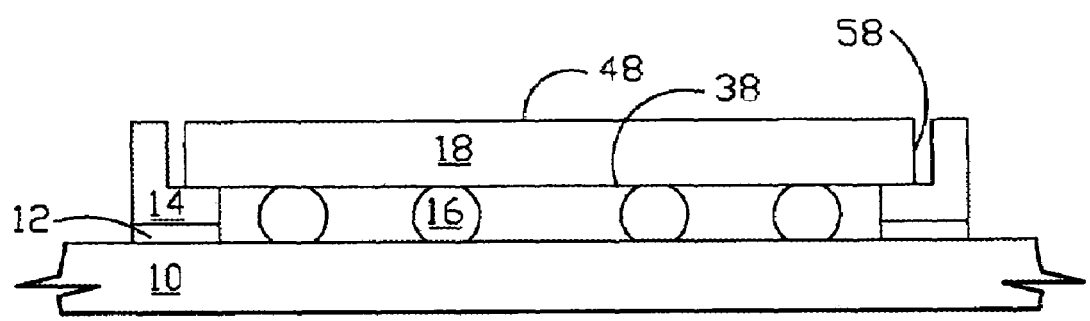

Then, referring to FIG. 1B, a package device located on the first heat-dissipating structure. In one embodiment, the package device consists of a die 18 (or package body) and multitudes of conductive bumps 16, in which the die 18 has a bottom surface 38, an upper surface 48, and a side wall 58 located between the bottom surface 38 and the upper surface 48. Moreover, the conductive bumps 16, such as solder ball or gold bump, located on the bottom surface 38, and adhered to the substrate 10. The key feature of the present invention is that the thermally conductive ring 14 contacts the portion of the bottom surface 38 to release the heat from the portion of bottom surface 38. The overall conductive bumps 16 are disposed within the opening 44 and surrounded by the inner wall 34. In this embodiment, the die 18 is disposed in the opening 45. Furthermore, the key feature of this embodiment is that the inner wall 34 of the thermally conductive ring 14 has a L-cross-section and the middle wall 35 that can assist the alignment process of the package device.

Notability, the inner circumference is defined by the inner wall 34 that is smaller than the outline circumference of the side wall 58, and the outline circumference is defined by the outer sidewall 36 is larger than the circumference of the side wall 58, such that the thermally conductive ring 14 can contact the portion of bottom surface 38. In addition, the total height of the inner wall 34 and the thermally conductive adhesive layer 12 is less than the height of the conductive bumps 16. For example the total height is 80% of height of the conductive bumps 16. But the total height is equally to the height of the conductive bumps 16 after re-flow process.

The one feature of the present invention is that the support is supplied by the height of the inner wall 34 of the thermally conductive ring 14 (when the height of the adhesion layer 12 is very small) that can prevent the conductive bumps 16 from collapsing, reduce the shear loading, underfill, and enhance the reliability and increase the life of the package device. In addition, the height of the outer wall 36 is about equal to the total height of the conductive bumps 16 and the die 18, thus, the heat for the sidewall 58 of the die 18 that can be released.

Figure 1C:
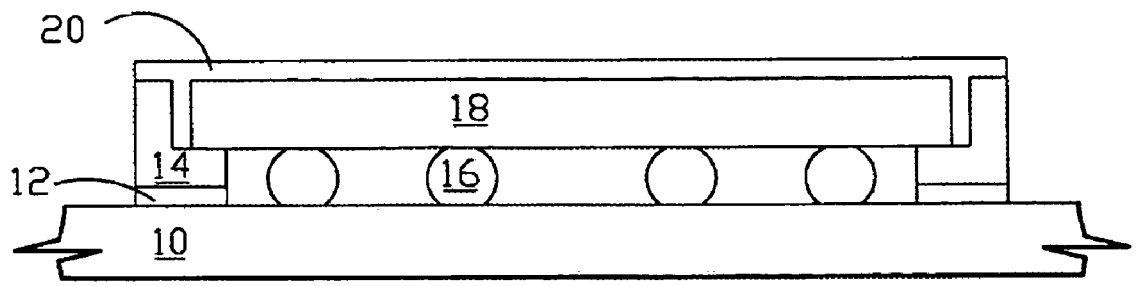

Next, as shown in FIG. 1C, another thermally conductive adhesive layer 29 filled between the sidewall 58 and the middle wall 35, and on the upper surface 48. The thermally conductive adhesive layer 20 is similar to the thermally conductive adhesive layer 12, which is made of the dielectric material, preferably a material that has a higher thermal conductivity. Thus, the thermally conductive adhesive layer 20 can assist to release the heat from the side wall 58 and the upper surface 48. Therefore, the thermally conductive adhesive layer 20 can use as a part device of the heat dissipation apparatus.

Figure 1D:
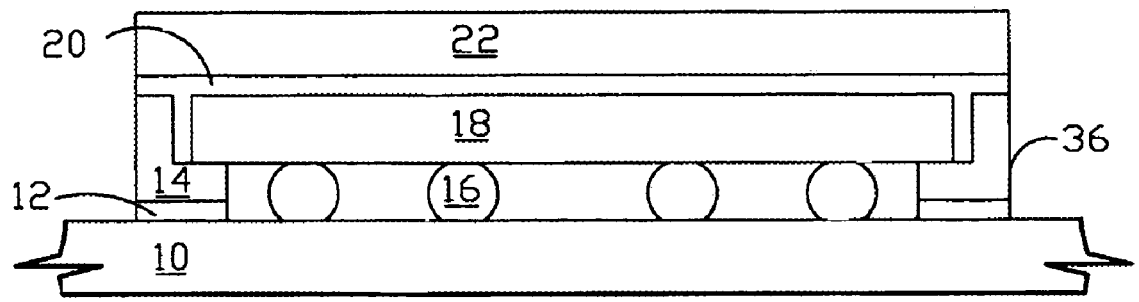

Then, as shown in FIG. 1D, a second heat-dissipating structure 22 located on the thermally conductive adhesive layer 20, that is, the second heat-dissipating structure 22 are disposed on the upper surface 48 to release the heat from the upper surface 48. The second heat-dissipating structure 22, such as a rigid rectangular heat sink, which is made of the thermally conductive material, such as Al or Cu. In this embodiment, the second heat-dissipating structure 22 has an outline circumference equal to the outline circumference of the thermally conductive ring 14. Thus, the second heat-dissipating structure and the thermally conductive ring 14 can be inlaid completely, and the package device is surrounded therein. In alternative embodiment (not shown in FIGS), the height of an outer wall 36 of the thermally conductive ring 14 is equal to the total height of the second heat-dissipating structure 22, die 18, and the conductive bumps 16, such that the second heat-dissipating structure 22 has an outline circumference that is equal to the circumference of the side wall 58 of the die 18. Similarly, the second heat-dissipating structure 22 and the thermally conductive ring 14 can be completely inlaid, so as to surround the package device therebetween.

Figure 2:
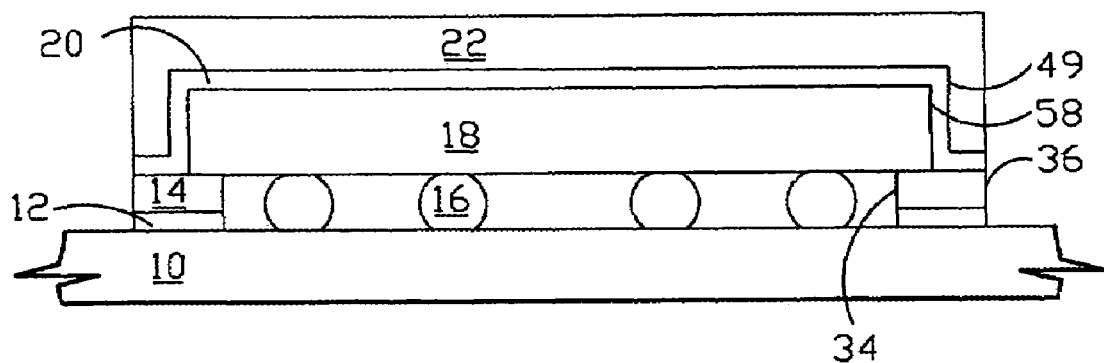
FIG. 2 is a schematic represents the heat dissipation apparatus and the cross-section view of the package device of the second embodiment in accordance with the present invention disclosed herein.

Next, FIG. 2 is a schematic, which represents the heat dissipation apparatus of the second embodiment and the cross-section view of the package device. The difference betweem the first embodiment is that the rectangular thermally conductive ring 14 does not have a middle wall 35 and the height 36 of the outer wall 36 is equal to the inner wall 34. Then, the second heat-dissipating structure 22, such as an inverse U-type heat sink has an inner wall 49 which defines the opening to contain the die 18 therein. The circumference of the inner wall 49 is larger than the circumference of the side wall 58 of the die 18. Furthermore, the side wall 58 of die 18 is surrounded by the inner wall 49 of the second heat-dissipating structure 22, so as to release the heat from the side wall 58. At the same time, the second heat-dissipating structure 22 releases the heat from the upper surface 48 of the die 18. Notability, in second embodiment, the die 18 can be first placed in the opening that defined by the inner wall 49 of the second heat-dissipating structure 22, so as to the second heat-dissipating structure 22 also can assist the alignment process of the package device.

Figure 3:
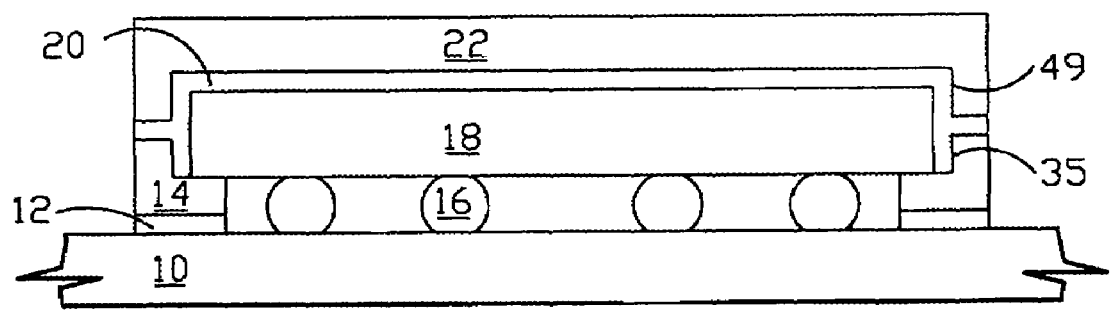
FIG. 3 is a schematic represents the heat dissipation apparatus of the third embodiment and the cross-section view of the package device in accordance with the present invention disclosed herein.

Next, FIG. 3 represents the third embodiment of the heat dissipation apparatus and the cross-section view of the package device. The different from the first embodiment is that the thermally conductive ring 14 has a middle wall 35, which the height of the middle 35 or outer wall 36 is higher than the inner wall 34, but the height is smaller than the total height of the die 18 and the thermal conductive bumps 16, so as to release the heat from the portion of the sidewall 58. However, the difference between the second embodiment is that the second heat-dissipating structure 22 has an inner wall 49 and the opening defined by the inner wall 49 to contain the portion of the die 18. The second heat-dissipating structure 22 also can release the heat from the portion of the side wall 58, even if the height of the inner wall is shorter than the die 18. Thus, in the third embodiment, the thermally conductive ring 14 and the second heat dissipating structure 22 (also includes the thermally conductive adhesive layer 20) can release the heat from the overall sidewall 58. It is noted that the shape of the thermally conductive ring 14 is a sample for this embodiment, but the embodiment is not in this limitation.

According to the abovementioned, the heat dissipation apparatus of this invention can dissipate the heat from three dimensions: upper surface, bottom surface, and the sidewall, have good heat dissipating efficiency that compares with the conventional heat sink, and prevents the conductive bumps from collapsing, and reduces the shear loading, so as to apply on the flip-chip or BGA package device.

The invention being thus described, it will be obvious that the same may be varied in many ways. Such variations are not to be regarded as a departure from die spirit and scope of the invention, and all such modifications as would be obvious to one skilled in the art are intended to be included within the scope of the following claims.

What is claimed is:

1. A package device, comprising:
   a substrate;
   a device located on said substrate, wherein said device having a first surface, a second surface, a sidewall between said first surface and said second surface, and said first surface having a plurality of conductive bumps to contact with said substrate directly;
   a first heat-dissipating structure having a thermally conductive ring attached to said substrate, wherein said first dissipating structure located between said device and said substrate and surrounding said plurality of said conductive bumps;
   a second heat-dissipating structure disposed on said second surface and adhered to said first heat-dissipating structure to cover said device; and
   a thermally conductive adhesive layer adhering to said device, said first heat-dissipating structure and said second heat-dissipating structure.

2. The package device according to claim 1, further comprising a thermally conductive adhesive layer adhering to said substrate and said first heat-dissipating structure.

3. The package device according to claim 1, wherein the height of an outer wall of said first heat-dissipating structure is substantially equal to the total height of said plurality of said conductive bumps and said device.

4. The package device according to claim 1, wherein said thermally conductive ring is a L-section type thermally conductive ring.

5. The package device according to claim 1, wherein said second heat-dissipating structure comprises a heat sink.

6. The package device according to claim 1, wherein said second heat-dissipating structure comprises a rectangular heat sink.

7. The heat dissipation apparatus according to claim 1, wherein said second beat-dissipating structure comprises an inverse U-type heat sink.

8. A package device, comprising;
   a substrate;
   a device located on said substrate, wherein said device having a first surface, a second surface, and a sidewall , said first surface having a plurality of conductive bumps and contacting said substrate directly;
   a first heat-dissipating structure having a thermally conductive ring attached to said substrate, wherein said first heat-dissipating structure disposed between said device and said substrate and surrounding said plurality of said conductive bumps; and
   a first thermally conductive adhesive layer adhering to said substrate and said thermally conductive ring;
   a second heat-dissipating structure disposed on said second surface and cooperating with said first heat-dissipating structure to cover said device; and
   a second thermally conductive adhesive layer adhering to said device, said first heat-dissipating structure and said second heat-dissipating structure.

9. The package device according to claim 8, wherein the height of an outer wall of said first heat-dissipating structure is substantially equal to the total height of said conductive bumps and said device.

10. The package device according to claim 8, wherein said thermally conductive ring is an L-section type thermally conductive ring.

11. The package device according to claim 8, wherein said second heat-dissipating structure comprises a heat sink.

12. The package device according to claim 8, wherein said second heat-dissipating structure comprises a rectangular heat sink.

13. The heat dissipation apparatus according to claim 8, wherein said second heat-dissipating structure comprises an inverse U-type heat sink.

* * * * *